US012677654B2

(12) United States Patent
van der Straten et al.

(10) Patent No.: US 12,677,654 B2
(45) Date of Patent: Jul. 7, 2026

(54) TERRACED CONDUCTOR STRUCTURE FOR SEMICONDUCTOR DEVICES

(71) Applicant: International Business Machines Corporation, Armonk, NY (US)

(72) Inventors: Oscar van der Straten, Guilderland Center, NY (US); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 458 days.

(21) Appl. No.: 18/346,999

(22) Filed: Jul. 5, 2023

(65) Prior Publication Data

US 2025/0014994 A1 Jan. 9, 2025

(51) Int. Cl.
*H01L 23/528* (2006.01)
*H10W 20/00* (2026.01)
*H10W 20/41* (2026.01)

(52) U.S. Cl.
CPC ....... *H10W 20/435* (2026.01); *H10W 20/056* (2026.01); *H10W 20/082* (2026.01); *H10W 20/425* (2026.01)

(58) Field of Classification Search
CPC ........... H01L 23/5283; H01L 21/76804; H01L 21/76877; H01L 23/53266; H01L 21/76885; H01L 23/5226
See application file for complete search history.

(56) References Cited

U.S. PATENT DOCUMENTS

| | | | |
|---|---|---|---|
| 9,418,889 B2 | 8/2016 | Mountsier et al. | |
| 9,613,853 B2 | 4/2017 | Chen et al. | |
| 10,256,186 B2 | 4/2019 | Bonilla et al. | |
| 11,296,022 B2 | 4/2022 | Patil et al. | |
| 11,315,827 B2 | 4/2022 | Huang et al. | |
| 11,562,961 B2 | 1/2023 | Lin | |
| 2020/0373165 A1* | 11/2020 | Park ................... | H10D 30/6219 |
| 2022/0223473 A1 | 7/2022 | Anderson et al. | |

* cited by examiner

*Primary Examiner* — Karen Kusumakar
(74) *Attorney, Agent, or Firm* — Harrity & Harrity, LLP

(57) ABSTRACT

A semiconductor device includes a metal line having a longitudinal axis. The metal line includes a first segment extending in a direction of the longitudinal axis and having a first cross-section, the first cross-section including a wider side and a narrower side. A second segment extends in a direction of the longitudinal axis and has a second cross-section, the second cross-section including a wider side and a narrower side. The narrower side of the second segment is formed in contact with the wider side of the first segment such that a portion of the wider side of the first segment extends beyond the narrow side of the second segment to form a terrace and the terrace and a tapered sidewall of the second segment form an acute angle.

18 Claims, 12 Drawing Sheets

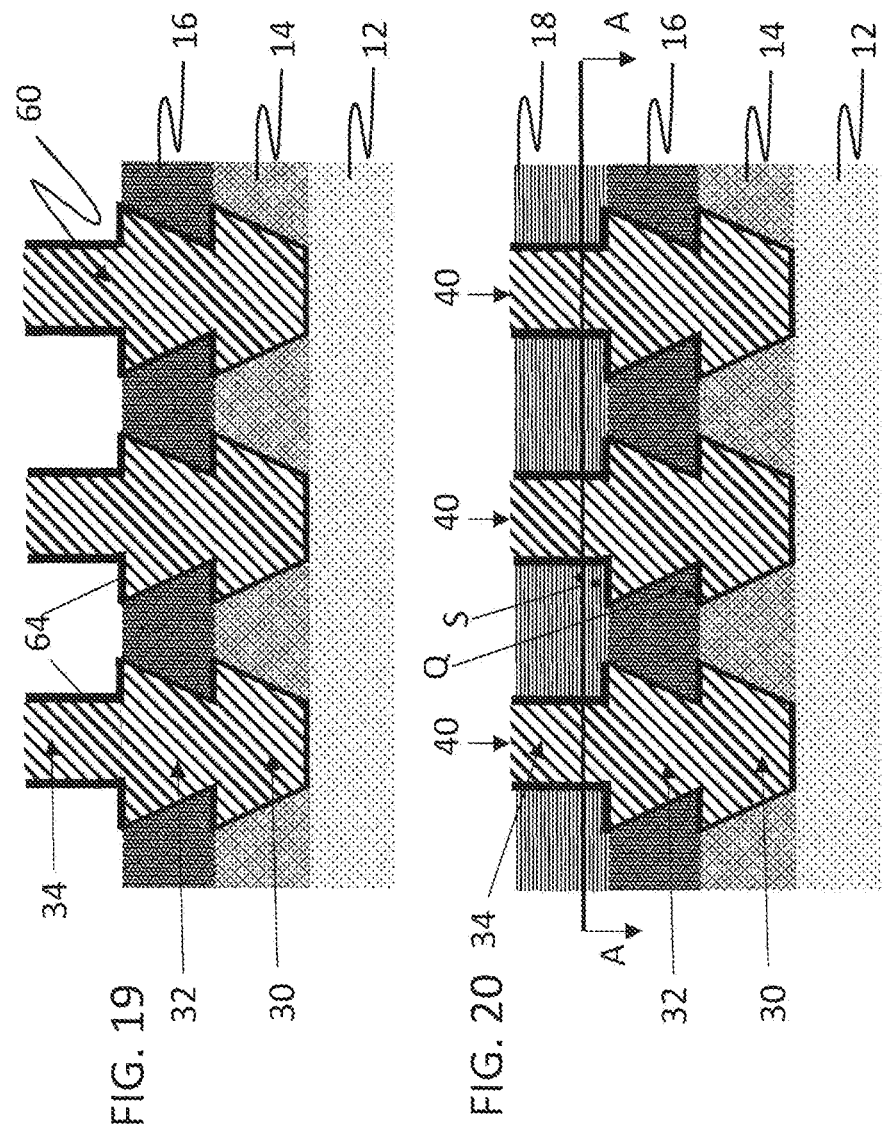

TERRACED CONDUCTOR STRUCTURE FOR SEMICONDUCTOR DEVICES

BACKGROUND

The present invention generally relates to wire structures, and more particularly to terraced or segmented wire structures having geometric features that prevent inconsistent critical dimensions between structures.

With shrinking metallization pitches in semiconductor processing of back end of line (BEOL) structures, Resistance/Capacitance (R/C) delay increases are becoming exceedingly large. This issue can, in part, be addressed by filling minimum critical dimension (CD) lines with materials for lower line resistance. However, such metallizations result in dielectric line wiggling caused by metal stress using these materials. Line wiggling or warping caused by stress results in CD variability and height variability of the conductive structures, e.g., metal lines, or can result in inconsistent dimensions through a structure. This is especially pronounced in the case with higher trench aspect ratio structures.

SUMMARY

In accordance with an embodiment of the present invention, a semiconductor device includes a metal line having a longitudinal axis. The metal line includes a first segment extending in a direction of the longitudinal axis and having a first cross-section, the first cross-section including a wider side and a narrower side. A second segment extends in a direction of the longitudinal axis and has a second cross-section, the second cross-section including a wider side and a narrower side. The narrower side of the second segment is formed in contact with the wider side of the first segment such that a portion of the wider side of the first segment extends beyond the narrow side of the second segment to form a terrace, and the terrace and a tapered sidewall of the second segment form an acute angle.

Another semiconductor device includes a plurality of parallel conductive lines spaced in accordance with a pitch dimension. Each of the plurality of conductive lines includes a first segment having a first cross-section, the first cross-section including a wider side and a narrower side. A second segment has a second cross-section, the second cross-section including a wider side and a narrower side, the narrower side being formed in contact with the wider side of the first segment such that a portion of the wider side of the first segment extends beyond the narrow side of the second segment to form a terrace and the terrace and a tapered sidewall of the second segment form an acute angle; and a third segment disposed on the wider side of the second cross-section.

A method for forming a semiconductor device includes depositing a first dielectric layer on a substrate, opening tapered trenches in the first dielectric layer and filling the tapered trenches with a first conductive material to form a first segment having a first cross-section, the first cross-section including a wider side and a narrower side. A second dielectric layer is deposited on the first dielectric layer and the first conductive material of the first segment. Tapered trenches are opened in the second dielectric layer and exposing the conductive material of the first segment, and a second conductive material is deposited in the tapered trenches to contact the first segment and over the second dielectric layer. The second conductive material is patterned to form a second segment having a second cross-section, the second cross-section including a wider side and a narrower side. A third dielectric layer is formed over the second segment.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 19 is a cross-sectional view showing the hard mask removed in accordance with an embodiment of the present invention;

FIG. 20 is a cross-sectional view showing a third dielectric layer deposited in accordance with an embodiment of the present invention;

DETAILED DESCRIPTION

Figures 1, 2:
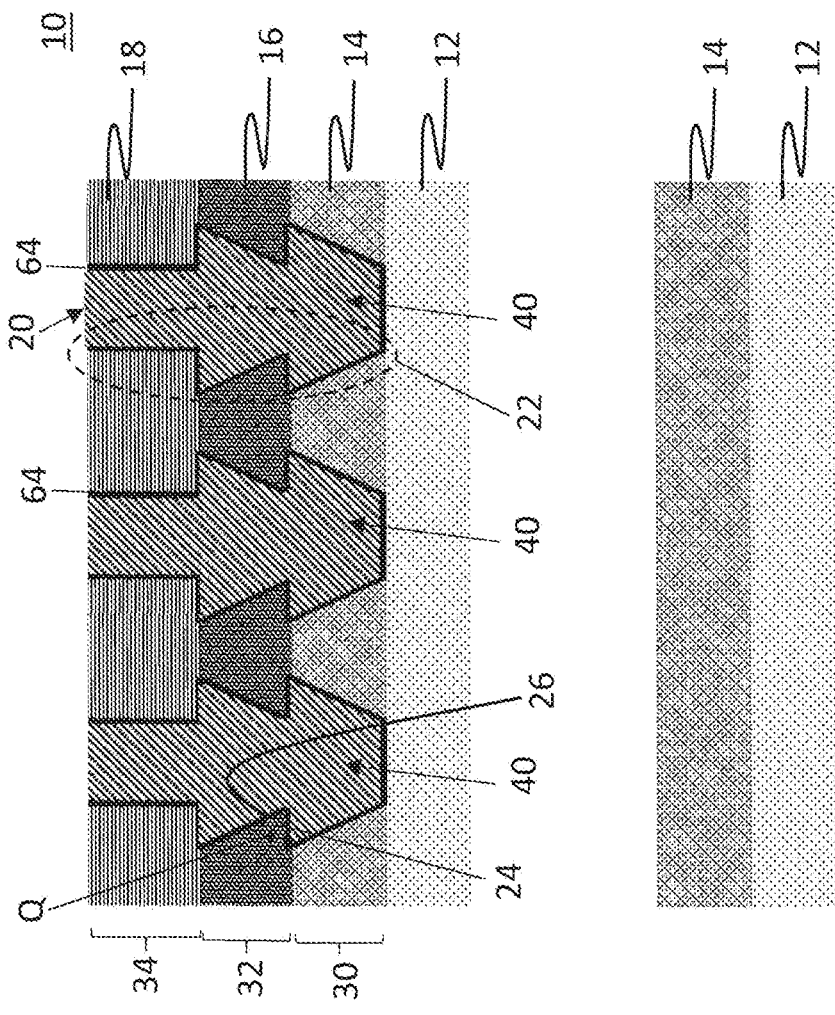
FIG. 1 is a cross-sectional view showing a semiconductor device with a plurality of segmented conductive structures forming terraced wires in accordance with an embodiment of the present invention.
FIG. 2 is a cross-sectional view showing a first dielectric layer formed on a substrate in accordance with an embodiment of the present invention.

In accordance with embodiments of the present invention, terraced wire structures are provided to address variability in conductive structures of semiconductor devices. For example variability of critical dimensions (CDs) and variability of height of the wire structures can be better controlled using a segmented or terraced sidewall profile of the conductive structures. In one embodiment, a segmented conductor is employed having one or more trapezoidal-shaped cross-sections, which are stacked on top of one another. Each segment of the segmented conductor can include an angled or tapered portion and a terraced portion. The terraced portion can include a portion that is transverse to the longitudinal axis of the wire structure.

The segmented conductor can include metal wires having a terraced profile for uniform height or line profiles for a plurality of parallel lines. These metal wires can pass through different dielectric materials along their depths in each segment. In one embodiment, stacked trapezoidal-shaped-cross-section wire sections with a sidewall angle of between about 60 to about 80 degrees can be provided. A top wire section can include a straight sidewall portion. The terraced wire structure can include metal fill materials, such as, e.g., Ru, Mo, Rh, W, Ir, Co, and alloys or combinations of these and other conductive materials.

The sidewall profiles of the segmented conductor can reduce CD variability that can result by metal deposition processes. Having an angled profile with a terrace portion can provide an anchoring of the segmented conductor during such processing. Further, additional material on the sidewalls can resist warping or flexing of the wires during fabrication processes. Greater uniformity of the metal structures across a device is achieved in accordance with embodiments of the present invention. In addition, scalability of advanced logic elements for logic circuits is extended due to uniform line profiles and heights of the metal wiring. Device performance overall is also improved due to reduced metal wire shorts from wiggling or flexing.

In some embodiments, the segmented conductors can include two or more segments. In other embodiments, the segmented conductors can have an alternating segment pattern where conductors alternate between straight segments and trapezoidal segments at each level or within each level.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor—or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS.

is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a semiconductor device 10 is shown in accordance with one embodiment. The device 10 includes a substrate 12 having multiple layers formed thereon. The substrate 12 can include any suitable substrate structure, e.g., a bulk semiconductor, a semiconductor-on-insulator (SOI) substrate, etc. In one example, the substrate 12 can include a silicon-containing material. Illustrative examples of Si-containing materials suitable for the substrate 12 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

While the substrate 12 can include a single semiconductor layer, the substrate can also be comprised of a plurality of different layers including one or more front end of line (FEOL) layers, one or more middle of the line layers (MOL) and/or one or more back end of line (BEOL) layers. These layers may include one or more active device layers, one or more dielectric layers, one or more metal layers, etc. In a particularly useful embodiment, terraced or segmented conductive structures 40 will be described as electrically contacting the substrate 12 and an upper level conductors (not shown) at interface 20. It should be understood that segments of the segmented conductive structures 40 can connect to vias or other connective structures to connect wires to each other or to other structures (e.g., a pad, another wire, a via, an electrical component, etc.). Vias can also be integrated into the segmented conductive structures 40 and can themselves include a terraced structure.

Segmented conductive structures 40 include a lower terraced segment 30, and a subsequent terraced segment 32. Segmented conductive structures 40 can also include a straight sidewall top segment 34. While the lower terraced segment 30 and the subsequent terraced segment 32 are depicted, it should be understood that any number of terraced segments (30, 32) can be employed. Each segment 30, 32, 34 can be disposed within a dielectric layer. Each of the segments 30, 32, 34 can include a corresponding dielectric layer, for example, dielectric layer 14, dielectric layer 16 and dielectric layer 18. These dielectric layers 14, 16 and 18 can include a same dielectric material, but can also include different dielectric materials. The dielectric layers 14, 16 and 18 can include a low-k dielectric material. A low-k dielectric material can include, but is not limited to: organic polymer low-k dielectrics (e.g., parylene), organosilicate-based low-k dielectric (e.g., SiCOH, SiCNOH), carbon doped silicon oxide (SiO:C), fluorine doped silicon oxide (SiO:F), a polymeric material, for example, tetraethyl orthosilicate (TEOS), hydrogen silsesquioxane (HSQ) and methylsilses-quioxane (MSQ), and combinations thereof.

Segmented conductive structures 40 can include metal wires having a terraced sidewall profile 22 for controlling height or line variability. Segmented conductive structures 40 can pass through different dielectric materials of dielec-tric layers 14, 16 and 18 along their depths or lengths for each wire section or segment to further provide control of variability between the segmented conductive structures 40. In one embodiment, segmented conductive structures 40 include stacked trapezoidal wire sections, each having an angled portion 26 and a terraced portion 24. The terraced portion 24 is preferably transverse to an axis of the seg-mented conductive structure 40 (e.g., wire). The terraced portion 24 forms a flat or terrace which increases stability of the segmented conductive structures 40 during the deposi-tion of the dielectric layers (e.g., dielectric layers 14, 16, and 18). In some embodiments, the terraced portion 24 and the angled portion 26 form a sidewall angle Q of between about 60 to about 80 degrees.

Segmented conductive structures 40 can include metal fill materials, such as, e.g., Ru, Mo, Rh, W, Ir, Co, and alloys or combinations of these and other conductive materials. Seg-mented conductive structures 40 can include a diffusion barrier 64 formed thereon. The diffusion barrier 64 can include, e.g., TiN, TiWN or TaWN although other barrier layers can be employed.

Line wiggling (e.g., lines curving due to stress, geometry or other factors) can occur as a result of filling trenches or holes with metal, especially high aspect ratio lines or trenches. In accordance with aspects of the present inven-tion, terraced segmented conductive structures 40 avoid wiggling even for high aspect ratio lines. Locally wider metal due to terracing provides additional stability and lower line resistance due to increased metal volume. In addition, metal fill is improved due to low aspect ratios and fewer or no voids form in the metal due to these lower aspect ratios.

An illustrative method will now be described for a plu-rality of parallel metal lines that extend into the page of the drawings. It is to be understood the metal lines can also be vertically disposed as vias traversing layers of a semicon-ductor device.

Referring to FIG. 2, an interlevel dielectric layer (ILD) such as dielectric layer 14 is formed on the substrate 12. The dielectric layer 14 can include a low-k dielectric material, such as, e.g., parylene, SiCOH, SiCNOH, SiO:C, SiO:F, TEOS, HSQ, MSQ and combinations thereof. Low-k dielec-tric material of dielectric layer 14 can be formed, e.g., by using a chemical vapor deposition (CVD) process or a plasma enhanced CVD (PECVD) process. The dielectric layer 14 is deposited to a desired thickness that will even-tually form the thickness of a segment of the segmented conductive structure 40.

Figures 3, 4:
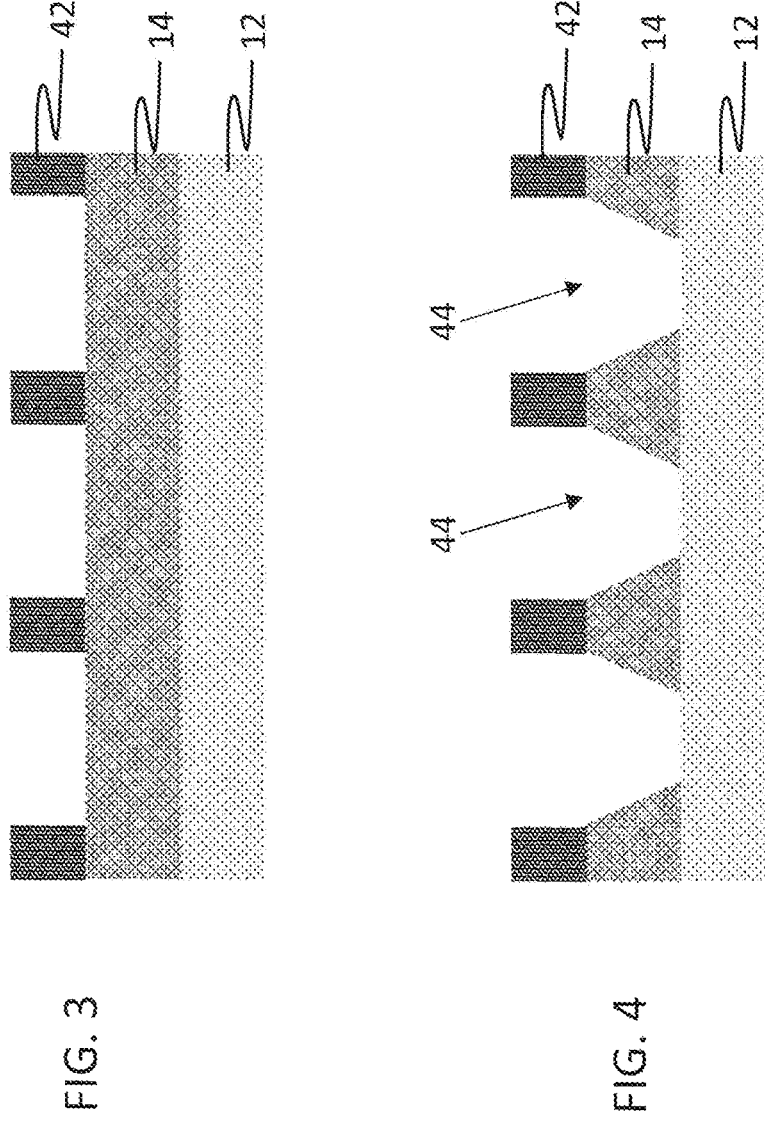
FIG. 3 is a cross-sectional view showing a hard mask formed on the first dielectric layer in accordance with an embodiment of the present invention.
FIG. 4 is a cross-sectional view showing tapered trenches formed in the first dielectric layer in accordance with an embodiment of the present invention.

Referring to FIG. 3, the dielectric layer 14 can be pat-terned by forming a hard mask layer 42 over the dielectric layer 14 and patterning the hard mask layer 42. The hard mask layer 42 can include a deposited dielectric hard mask material, e.g., SiN or SiO₂. A photoresist pattern (not shown) is formed on the hard mask layer 42 using lithography process steps. A photoresist pattern is transferred into the hard mask layer using a dry etch process forming a hard mask pattern. Next, the photoresist pattern is removed.

Referring to FIG. 4, the hard mask pattern of hard mask layer 42 is transferred into the dielectric layer 14 during a selective etching process, which etches the dielectric layer 14 selective to the substrate 12 and the hard mask layer 42. In one embodiment, an ion beam etch (IBE) is employed to provide a tapered form to the formed trenches 44. In another embodiment, a reactive ion etch (RIE) is employed to provide the tapered form to the formed trenches 44.

Figure 5:
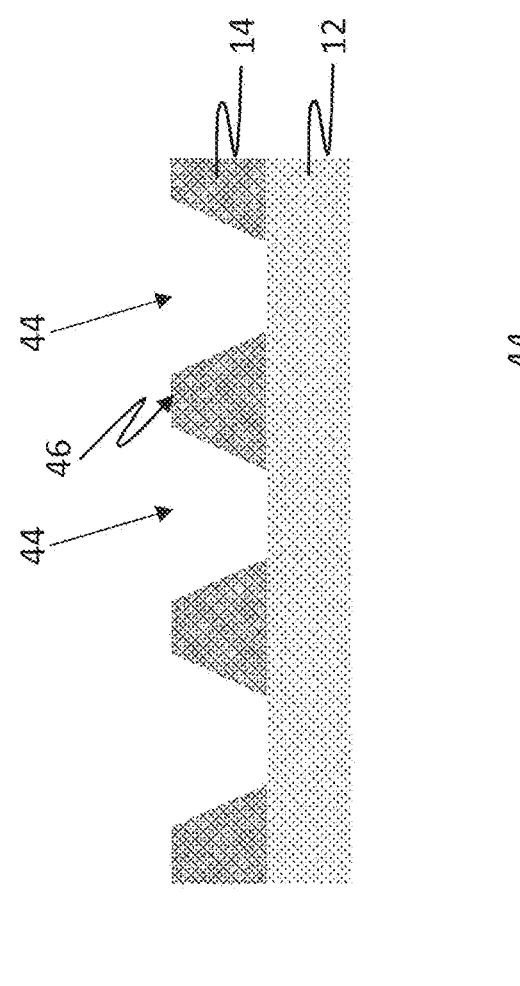
FIG. 5 is a cross-sectional view showing the tapered trenches after the removal of the hard mask in accordance with an embodiment of the present invention.

Referring to FIG. 5, the hard mask pattern of hard mask layer 42 is removed from a top 46 of the dielectric layer 14 during a selective etching process or a chemical mechanical polishing (CMP) step. The etch would be selective to the substrate 12 to remove the hard mask layer 42.

Figure 6:
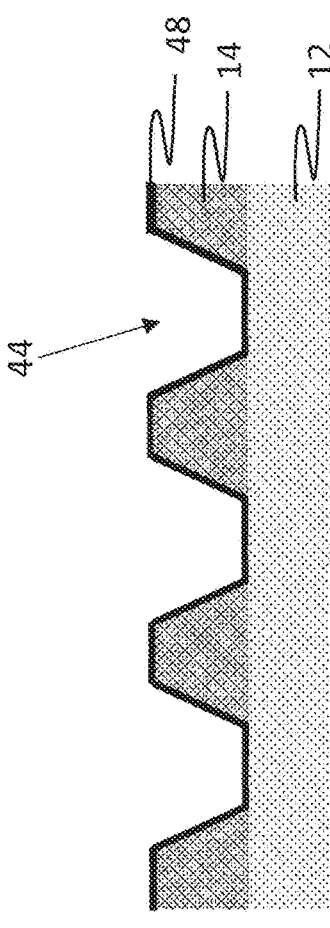
FIG. 6 is a cross-sectional view showing the tapered trenches having a diffusion barrier formed thereon in accordance with an embodiment of the present invention.

Referring to FIG. 6, a diffusion barrier or metal liner 48 is conformally deposited over the topography of the dielec-tric layer 14. The diffusion barrier 48 can be deposited by an atomic layer deposition (ALD) process, although other pro-cesses may be employed. The diffusion barrier 48 can include a material such as, e.g., TiN, TiWN, TaWN or the like.

Figure 7:
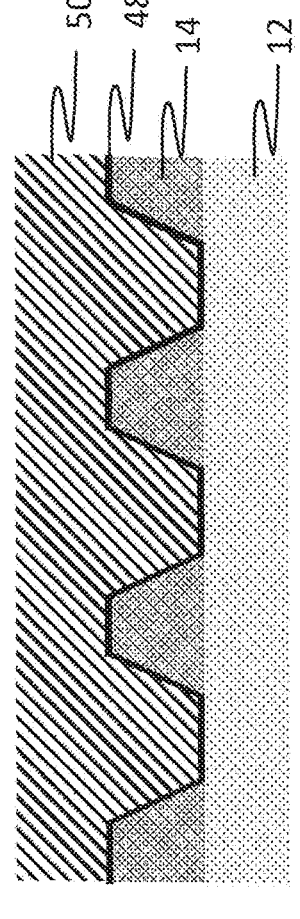
FIG. 7 is a cross-sectional view showing the tapered trenches filled with a conductive material in accordance with an embodiment of the present invention.

Referring to FIG. 7, a conductive fill 50 is performed to fill the trenches 44 (FIG. 6) on top of the diffusion barrier 48. The conductive fill 50 can include materials, such as, e.g., Ru, Mo, Rh, W, Ir, Co, and alloys or combinations of these and other conductive materials. In a particularly useful embodiment, the conductive fill 50 includes Ru. The con-ductive fill 50 can be formed using a deposition method, such as, e.g., chemical vapor deposition (CVD), plasma enhanced CVD (PECVD) or any other suitable deposition method. The low aspect ratio form of the trenches 44 (FIG. 6) relieves any concern about gap fill voids. In addition, this low aspect ratio relieves concern of the lines developing curves or wiggles as they extend into or out of the page of drawing FIG. 7.

Figure 8:
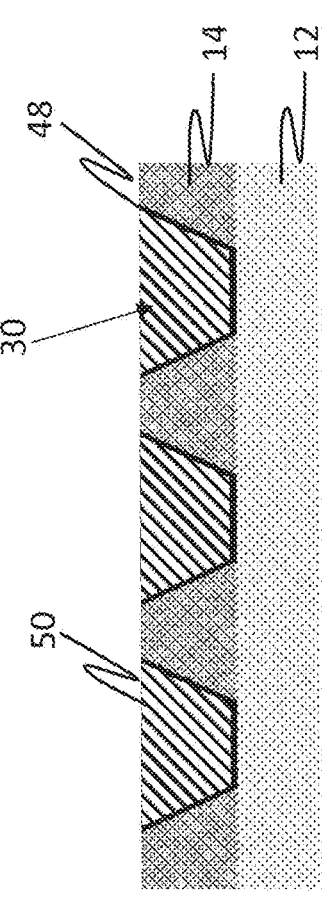
FIG. 8 is a cross-sectional view showing the conductive material planarized to form conductors for a first segment in accordance with an embodiment of the present invention.

Referring to FIG. 8, the conductive fill 50 is planarized to form a first segment (segment 30) of the segmented con-ductive structures 40. In one embodiment, the planarization process includes a chemical mechanical polish (CMP) to reduce the conductive fill to a surface of the dielectric layer 14. This CMP process also removes the diffusion barrier 48 from the surface of the dielectric layer 14.

Figure 9:
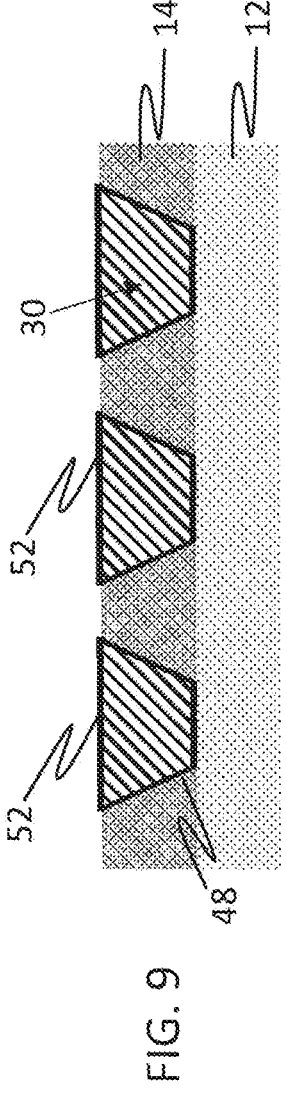
FIG. 9 is a cross-sectional view showing the first segments having a top liner formed thereon in accordance with an embodiment of the present invention.

Referring to FIG. 9, a top liner 52 is formed over exposed regions of the conductive fill 50. In one embodiment, the top liner 52 is selectively deposited on the conductive material of the segment 30. The selective deposition can include a CVD deposition process. The top liner 52 can include a same material or different material than that of the liner 48. The top liner 52 can include e.g., TiN, TiWN, TaWN or the like.

Figure 10:
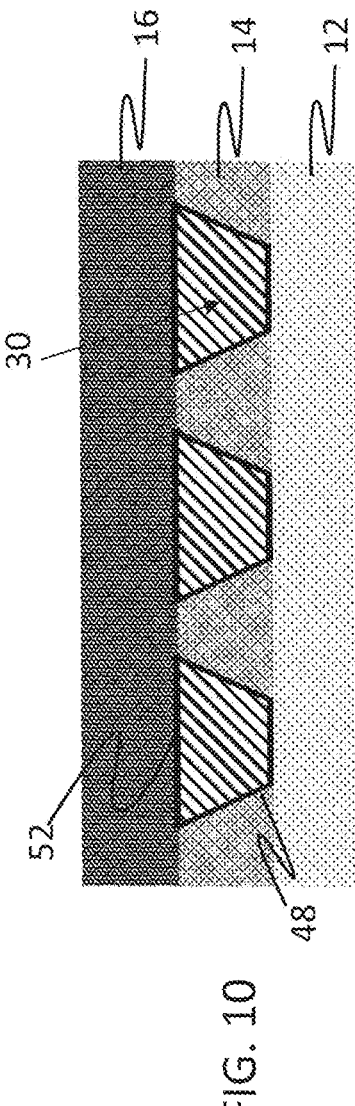
FIG. 10 is a cross-sectional view showing a second dielectric layer formed on the first segments in accordance with an embodiment of the present invention.

Referring to FIG. 10, a next dielectric layer is formed (dielectric layer 16) and can include the same of a different material than dielectric layer 14. The dielectric layer 16 can include a low-k dielectric material, such as, e.g., parylene, SiCOH, SiCNOH, SiO:C, SiO:F, TEOS, HSQ, MSQ and combinations thereof. Low-k dielectric material of dielectric layer 16 can be formed, e.g., by using a CVD process or PECVD process. The dielectric layer 16 is deposited to a desired thickness that will eventually form the thickness of a next segment of the segmented conductive structure 40.

Figures 11, 12:
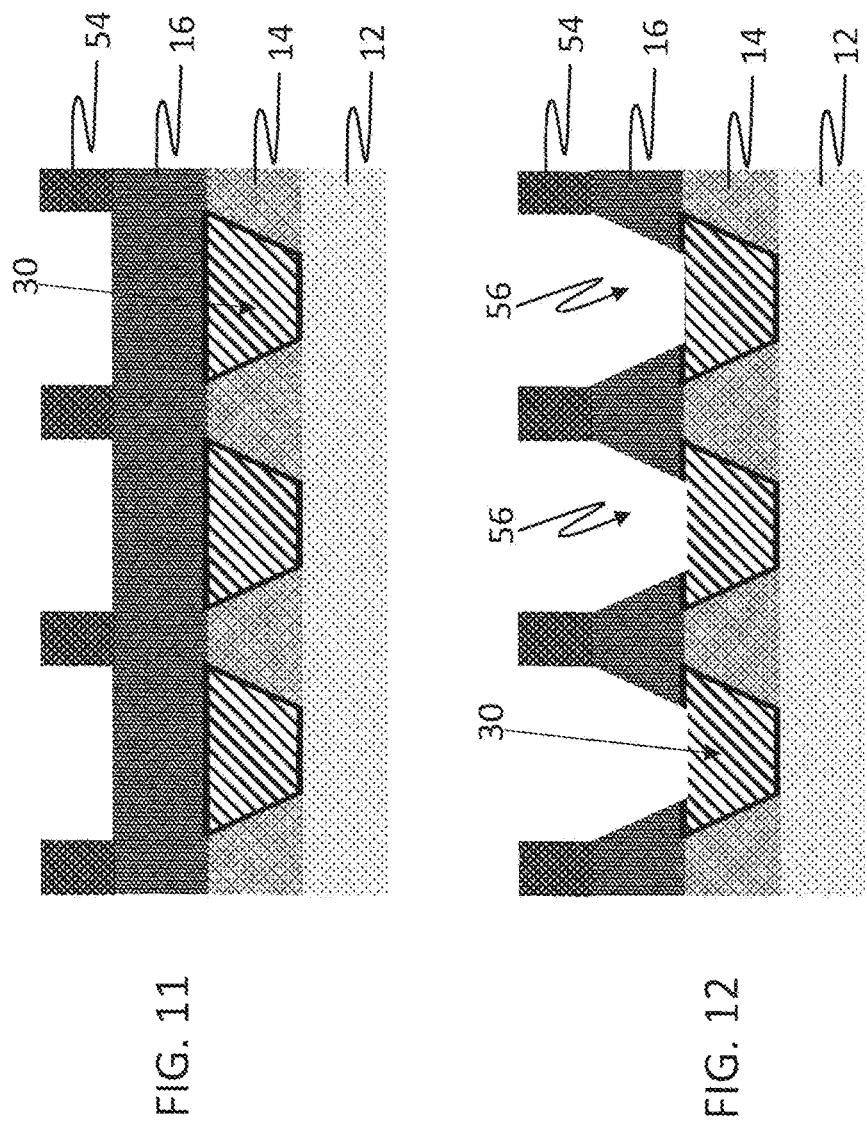
FIG. 11 is a cross-sectional view showing a hard mask patterned on the second dielectric layer in accordance with an embodiment of the present invention.
FIG. 12 is a cross-sectional view showing the second dielectric layer patterned to form tapered trenches in accordance with an embodiment of the present invention.

Referring to FIG. 11, the dielectric layer 16 can be patterned by forming a hard mask layer 54 over the dielectric layer 16 and patterning the hard mask layer 54. The hard mask layer 54 can include a deposited dielectric hard mask material, e.g., SiN or SiO₂. A photoresist pattern (not shown) can be applied to the hard mask layer 54 using lithography process steps to form a hard mask pattern. Next, the pho-toresist pattern is removed.

Referring to FIG. 12, the hard mask pattern of hard mask layer 54 is transferred into the dielectric layer 16 during a selective etching process, which etches the dielectric layer 16 selective to underlying materials and the hard mask layer 54. In one embodiment, an ion beam etch (IBE) is employed to provide a tapered form to the formed trenches 56. In another embodiment, a reactive ion etch (RIE) is employed to provide the tapered form to the formed trenches 56. The selective etching process opens the conductive material to expose the segment 30 within trenches 56.

Figures 13, 14:
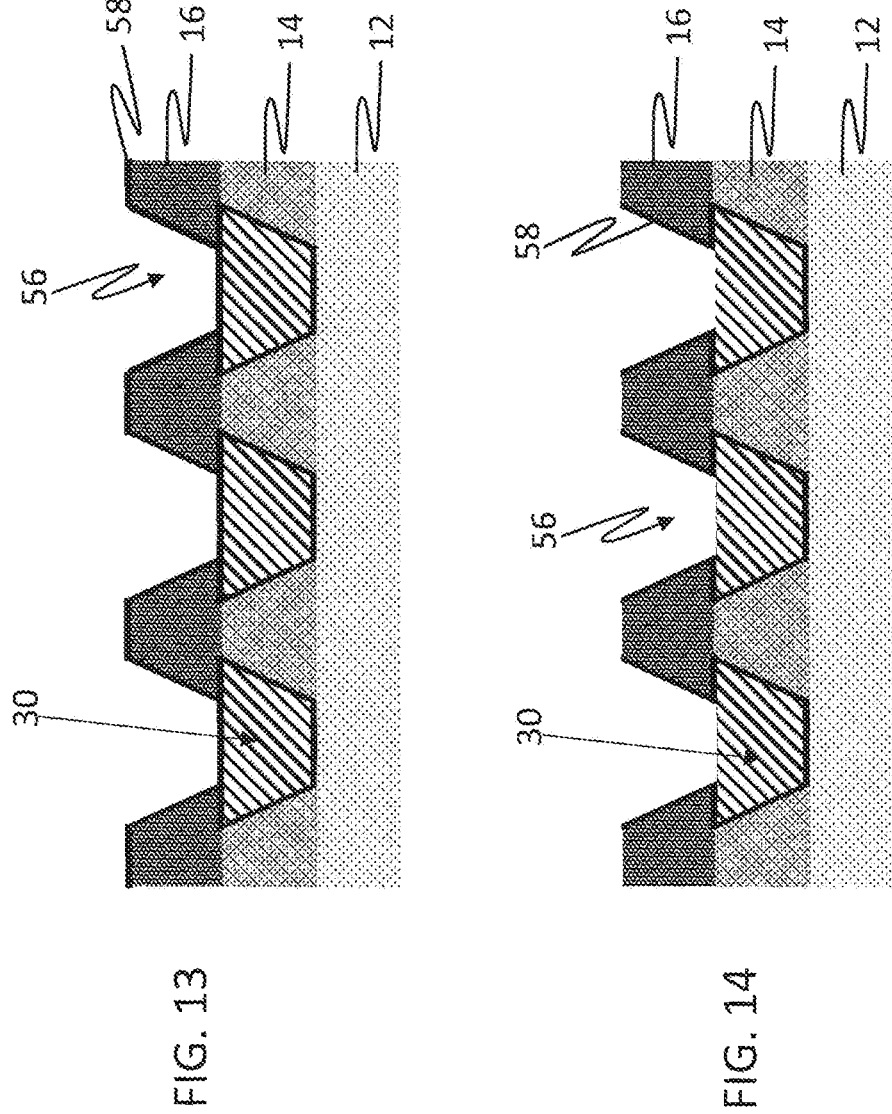
FIG. 13 is a cross-sectional view showing a diffusion barrier formed on the second dielectric layer and the first segments in accordance with an embodiment of the present invention.
FIG. 14 is a cross-sectional view showing an etch back of the diffusion barrier from the plateaus of the second dielectric layer and the first segments in accordance with an embodiment of the present invention.

Referring to FIG. 13, the hard mask layer 54 is removed from the dielectric layer 16 during a selective etching process or a chemical mechanical polishing (CMP) step. The etch would be selective to the conductive fill 50 and the dielectric layer 16 to remove the hard mask layer 54. A diffusion barrier 58 is formed over the exposed surfaces of the conductive fill 50 of segment 30 and over the surfaces of the dielectric layer 16. The diffusion barrier 58 can be deposited by an ALD process, although other processes may be employed. The diffusion barrier 58 can include a material such as, e.g., TiN, TiWN, TaWN or the like.

Referring to FIG. 14, the diffusion barrier 58 can be removed from the exposed surfaces of the conductive fill 50 of segment 30 by an etch-back process. The etch-back process can take advantage of the orientation of the diffusion barrier 58 to selectively remove the diffusion barrier from the surface of the segments 30 and plateaus of the dielectric layer 16 while other portions of the diffusion barrier remain on tapered surfaces of the dielectric layer 16.

Figures 15, 16:
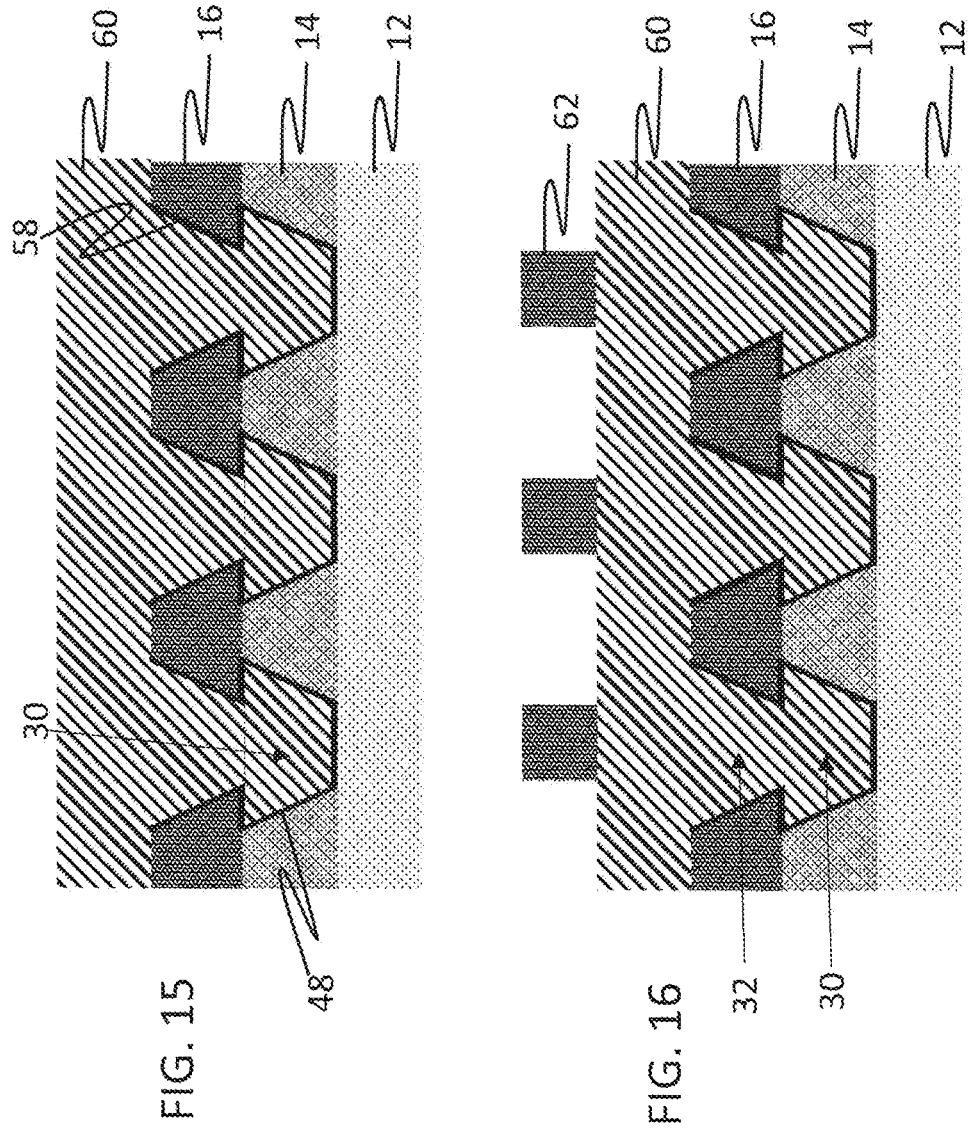
FIG. 15 is a cross-sectional view showing a conductive fill of the tapered trenches in the second dielectric layer and over the device in accordance with an embodiment of the present invention.
FIG. 16 is a cross-sectional view showing a hard mask patterned on the conductive fill in accordance with an embodiment of the present invention.

Referring to FIG. 15, a conductive fill 60 is performed to fill the trenches 56 (FIG. 14) on top of the diffusion barriers 48, 58 and in contact with top liner 52. The conductive fill 60 can include materials, such as, e.g., Ru, Mo, Rh, W, Ir, Co, and alloys or combinations of these and other conductive materials. In a particularly useful embodiment, the conductive fill 60 includes Ru. The conductive fill 60 can be formed using a deposition method, such as, e.g., CVD, PECVD or any other suitable deposition method. The low aspect ratio form of the trenches 56 (FIG. 14) relieves any concern about gap fill voids. In addition, this low aspect ratio relieves concern of the lines developing curves or wiggles as they extend into or out of the page of drawing FIG. 15.

Figures 17, 18:
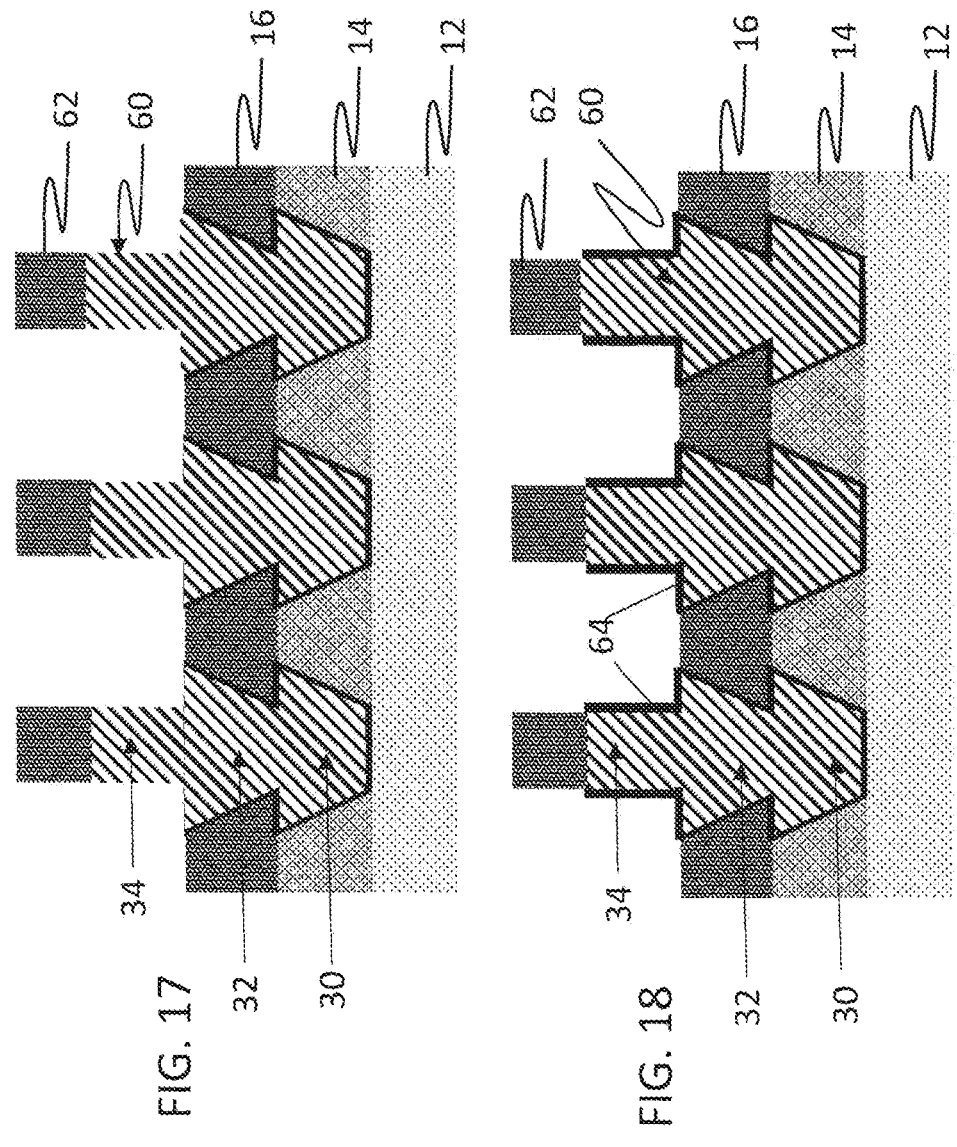
FIG. 17 is a cross-sectional view showing the conductive fill patterned to concurrently form second and third segments in accordance with an embodiment of the present invention.
FIG. 18 is a cross-sectional view showing a diffusion barrier formed on exposed portions of the second and third segments in accordance with an embodiment of the present invention.

Referring to FIG. 16, the conductive fill 60 is planarized, e.g., by CMP. This CMP process can be performed to stop on the dielectric layer 16 if no additional segments are needed. However, in accordance with the illustrative embodiment described, conductive fill 60 provide sufficient depth to form a subsequent segment (segment 32) as well as a straight sidewall segment 36 (FIG. 1). Referring to FIG. 17, segments 32 and 34 can be formed concurrently by an etch process. A hard mask layer 62 is formed, and patterned using lithographic processing. The hard mask pattern is transferred into the conductive fill 60 by, e.g., an ion beam etch (IBE) or reactive ion etch (RIE). The etching process stops on the dielectric layer 16. The hard mask pattern can provide a critical dimension width for segment 34. In this way, the segments 30 and 32 can have a width that exceeds the critical dimension of segment 34.

Referring to FIG. 18, a diffusion barrier 64 is formed over the exposed surfaces of the conductive fill 60 of segments 32 and 34. The diffusion barrier 64 can be selectively deposited by a CVD process, although other processes may be employed. The diffusion barrier 64 can include a material such as, e.g., TiN, TiWN, TaWN or the like.

Referring to FIG. 19, the hard mask layer 62 is removed from the conductive fill 60 by a CMP step.

Figure 21:
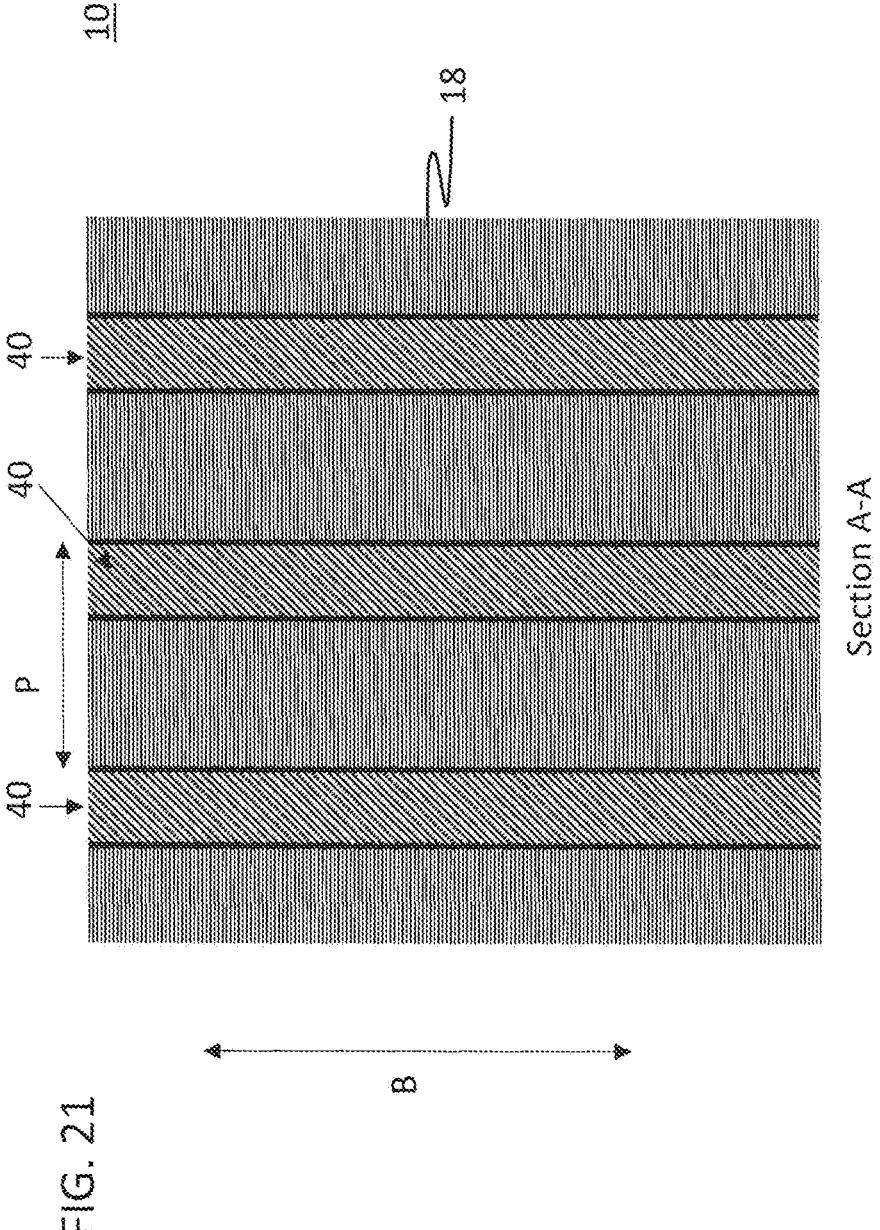
FIG. 21 is a top-down view showing a section taken at section line A-A in FIG. 20 in accordance with an embodiment of the present invention.

Referring to FIG. 20, a dielectric deposition process is performed to form dielectric layer 18. In one embodiment, the dielectric layer 18 includes a selectively deposited low-k dielectric. The dielectric layer 18 can include a low-k dielectric material, such as, e.g., parylene, SiCOH, SiCNOH, SiO:C, SiO:F, TEOS, HSQ, MSQ and combinations thereof. Low-k dielectric material of dielectric layer 18 can be formed, e.g., by using a selective CVD process or selective PECVD process. It should be understood that the materials for dielectric layers 14, 16 and 18 can be the same or different materials, e.g., different dielectric materials for bottom, middle and top wire sections. The dielectric layers 14, 16 and 18 are all preferably low-k dielectrics. FIG. 21 shows a top-down view taken at section line A-A in FIG. 20.

Referring now to FIGS. 20 and 21, segmented conductive structures 40 can include terraced wire structures for low resistance advanced interconnects. The segmented conductive structures 40 are arranged as a plurality of parallel conductive lines spaced at a pitch P. Pitch P is particularly useful at dimensions below about 30 nm. The segmented conductive structures (terraced wire structures) 40 can include at least two stacked trapezoidal-shaped cross-sections with wider top portion. In one embodiment, the trapezoidal-shaped cross-sections can include a sidewall angle Q (ranging from about 60 to about 80 degrees). Angle Q can be determined to be between a lower terrace portion and a tapered portion of the adjacent segment.

A top wire section of segment 34 can have a straight sidewall angle S (substantially perpendicular about 90 degrees) with a bottom surface of the segment 34 coplanar with the surface of a topmost trapezoidal wire section of segment 32.

As with each interlevel dielectric layer 14, 16 and 18 being formed separately, in some embodiments, different metal liners can be employed on the sidewalls of the segments 30, 32 and 34, although the same material may also be employed. In addition, the size the segments 30, 32 and 34 can have the same or different taper angles, have the same of different heights and widths, and can include different shapes or features along their lengths along a longitudinal axis (e.g., an axis in the direction of arrow B in FIG. 21).

Shorter trenches in the direction of arrow B can result is less wiggle. However, with increasing aspect ratio (line height) and line length (in the direction of arrow B) wiggle increases and critical dimension variability increases. In accordance with embodiments of the present invention, critical dimension variability is greatly reduced or eliminated by employing segmented conductors 40. Since line heights can usually exceed width critical dimensions (e.g., lines heights can exceed e.g., 47 nm), multiple trapezoidal cross-section wire segments can be employed by repeating the process steps for a second segment having a trapezoidal cross-section formed on a first segment having a trapezoidal cross-section, The stack of trapezoidal cross-section segments will depend on an overall aspect ratio limit. It should be understood that the segmented conductors 40 can be employed in any device where metal lines are employed.

Figure 22:
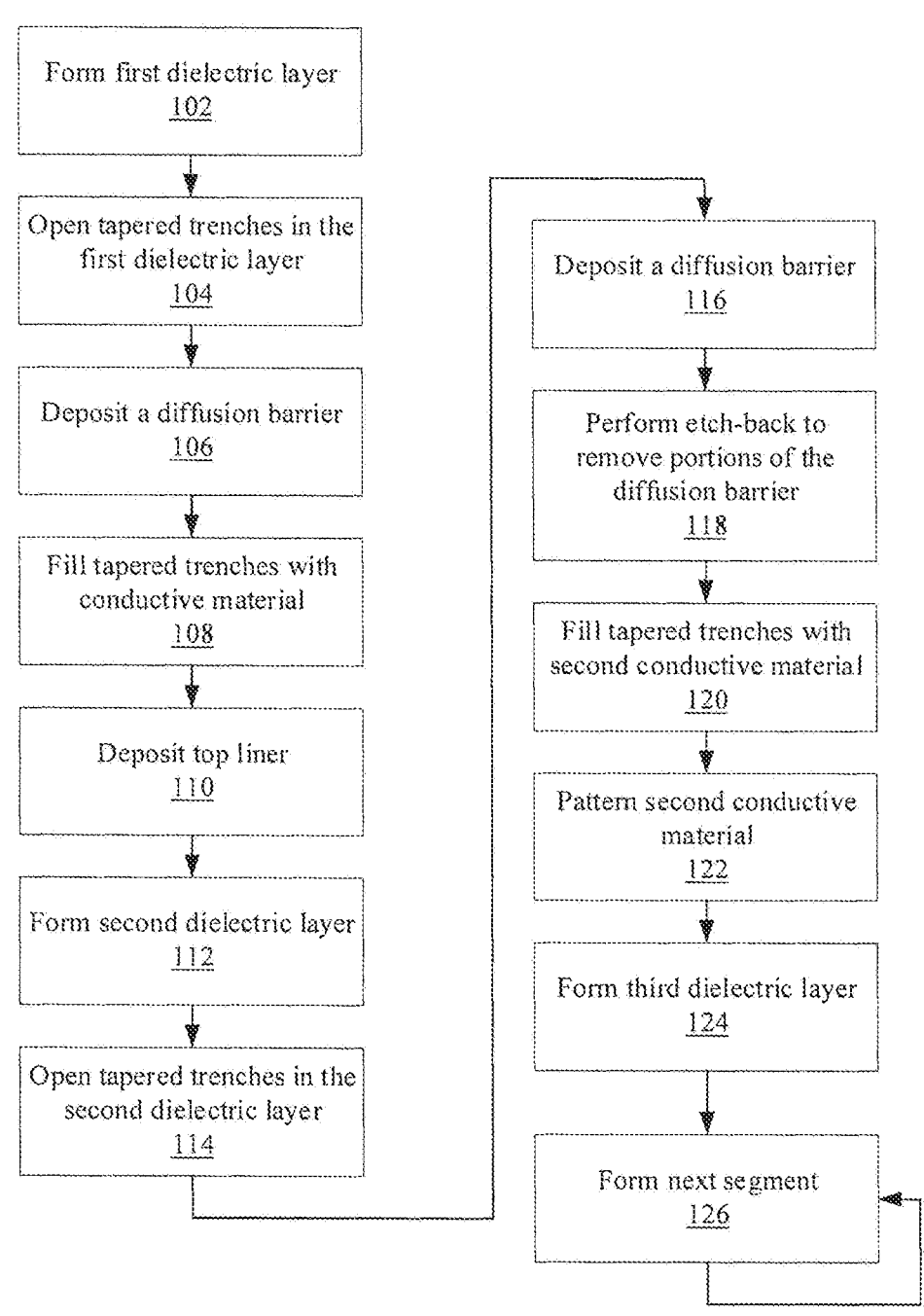
FIG. 22 is a block/flow diagram showing methods for fabricating a semiconductor device having terraced wires in accordance with an embodiment of the present invention.

Referring to FIG. 22, methods for forming a semiconductor device with terraced wire conductors is described. In block 102, a first dielectric layer is formed on a substrate, e.g., by a deposition process such as CVD, PECVD, etc. In block 104, tapered trenches are opened in the first dielectric layer. This can include an etching process such as IBE or RIE. In block 106, a barrier layer may be optionally deposited to line the tapered sidewalls. In block 108, the tapered trenches are filled with a first conductive material. This can include any suitable metal deposition process. Metal fill materials can include, e.g., Ru, Mo, Rh, W, Ir, Co, and alloys or combinations of these and other conductive materials. In useful embodiments, Ru and its alloys can be employed.

In block 110, in one embodiment, a top liner is selectively deposited over the first conductive material in the trenches. In block 112, a second dielectric layer is formed or deposited on the first dielectric layer and the first conductive material of the first segment or the selectively deposited top liner if employed. In block 114, tapered trenches are opened in the second dielectric layer and the conductive material of the first segment are exposed. In block 116, a diffusion barrier can be applied over the second dielectric layer and the first segment. In block 118, an etch-back can be performed to remove the diffusion barrier from the first segment and horizontal surfaces of the second dielectric layer. The tapered sidewalls will still include the diffusion barrier.

In block 120, a second conductive material is deposited in the tapered trenches to contact the first segment and over the second dielectric layer. In block 122, the second conductive material is patterned to form a second segment having a second cross-section, the second cross-section including a wider side and a narrower side. In block 124, a third dielectric layer is formed or deposited over the second segment. Processing can continue with steps to complete the device by adding any number of additional segments or segment layers in block 126.

In some embodiments, a next segment (top segment) can be patterned concurrently with a previous segment (e.g., the second segment). The top segment can have straight sidewalls. In other embodiments, a next segment can be formed in a same manner as the second segment onto a previous segment. In this instance, each segment can have, e.g., a trapezoidal cross-section or other shaped cross-section with a wider side on top and a narrower side toward a bottom. The wider side of the first segment can extend beyond the narrow side of the second segment to form a terrace and the terrace and a tapered sidewall of the second segment form an acute angle.

Any number of segments can be stacked. Each segment can have a corresponding dielectric material and a corresponding diffusion barrier material. The dielectric material and the diffusion barrier material can also be a same type. The last segment after all segments are completed can optionally include a top segment with straight sidewalls or the last segment can include any profile, as needed. Processing can continue to complete the semiconductor device by adding additional components and layers in accordance with the design of the device.

The flowchart and block diagrams in the Figures illustrate the architecture, functionality, and operation of possible implementations according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
   a metal line having a longitudinal axis, the metal line including:
      a first segment extending in a direction of the longitudinal axis and having a first cross-section, the first cross-section including a wider side and a narrower side, and a trapezoidal shape; and
      a second segment extending in a direction of the longitudinal axis and having a second cross-section, the second cross-section including a wider side and a narrower side, the narrower side of the second segment being formed in contact with the wider side of the first segment such that a portion of the wider side of the first segment extends beyond the narrower side of the second segment to form a terrace, and the terrace and a tapered sidewall of the second segment form an acute angle.

2. The semiconductor device as recited in claim 1, wherein the first cross-section is disposed within a first interlevel dielectric layer.

3. The semiconductor device as recited in claim 2, wherein the second cross-section is disposed within a second interlevel dielectric layer having a different material than the first interlevel dielectric layer.

4. The semiconductor device as recited in claim 1, further comprising a third segment disposed on the wider side of the second cross-section.

5. The semiconductor device as recited in claim 4, wherein the third segment includes a straight sidewall perpendicular to the wider side of the second cross-section.

6. The semiconductor device as recited in claim 1, wherein the metal line includes Ru.

7. The semiconductor device as recited in claim 1, further comprising a diffusion barrier between the metal line and an interlevel dielectric layer.

8. The semiconductor device as recited in claim 7, wherein the diffusion barrier includes different materials between the first segment and the second segment.

9. The semiconductor device as recited in claim 1, further comprising at least one other segment extending in a direction of the longitudinal axis and having an associated cross-section, the associated cross-section including a wider side and a narrower side, the narrower side being formed in contact with the wider side of a previous segment such that a portion of the wider side extends beyond the narrower side of the previous segment to form a terrace, and the terrace and a tapered sidewall of the previous segment form an acute angle.

10. A semiconductor device, comprising:
    a plurality of parallel conductive lines spaced in accordance with a pitch dimension, each of the plurality of conductive lines including:

a first segment having a first cross-section, the first cross-section including a wider side and a narrower side, and a trapezoidal shape;

a second segment having a second cross-section, the second cross-section including a wider side and a narrower side, the narrower side being formed in contact with the wider side of the first segment such that a portion of the wider side of the first segment extends beyond the narrower side of the second segment to form a terrace and the terrace and a tapered sidewall of the second segment form an acute angle; and a third segment disposed on the wider side of the second cross-section.

11. The semiconductor device as recited in claim 10, wherein the first cross-section is disposed within a first interlevel dielectric layer.

12. The semiconductor device as recited in claim 11, wherein the second cross-section is disposed within a second interlevel dielectric layer having a different material than the first interlevel dielectric layer.

13. The semiconductor device as recited in claim 10, wherein the third segment includes a straight sidewall perpendicular to the wider side of the second cross-section.

14. The semiconductor device as recited in claim 10, wherein each of the plurality of conductive lines includes a diffusion barrier between the conductive line and an interlevel dielectric layer.

15. A method for forming a semiconductor device, comprising:

depositing a first dielectric layer on a substrate;

opening tapered trenches in the first dielectric layer;

filling the tapered trenches with a first conductive material to form a first segment having a first cross-section, the first cross-section including a wider side and a narrower side, and a trapezoidal shape;

depositing a second dielectric layer on the first dielectric layer and the first conductive material of the first segment;

opening tapered trenches in the second dielectric layer and exposing the first conductive material of the first segment;

depositing a second conductive material in the tapered trenches to contact the first segment and over the second dielectric layer;

patterning the second conductive material to form a second segment having a second cross-section, the second cross-section including a wider side and a narrower side; and depositing a third dielectric layer over the second segment.

16. The method as recited in claim 15, wherein each of the second cross-section includes a trapezoidal shape.

17. The method as recited in claim 15, wherein patterning the second conductive material includes patterning a third segment with the second segment, the third segment having straight sidewalls.

18. The method as recited in claim 15, wherein the wider side of the first segment extends beyond the narrower side of the second segment to form a terrace and the terrace and a tapered sidewall of the second segment form an acute angle.

* * * * *